United States Patent
Carpenter, Jr. et al.

(10) Patent No.: US 6,600,205 B2
(45) Date of Patent: Jul. 29, 2003

(54) METHOD FOR MAKING LOW VOLTAGE TRANSISTORS WITH INCREASED BREAKDOWN VOLTAGE TO SUBSTRATE HAVING THREE DIFFERENT MOS TRANSISTORS

(76) Inventors: John H. Carpenter, Jr., 6709 Windward View Dr., Rowlett, Dallas County, TX (US) 75088; Joseph A. Devore, 2103 Portsmouth Dr., Richardson, Dallas County, TX (US) 75082; Toru Tanaka, 5349 Amesbury, Apt. 813, Dallas, Dallas County, TX (US) 75206

( * ) Notice: Subject to any disclaimer, the term of this patent is extended or adjusted under 35 U.S.C. 154(b) by 0 days.

(21) Appl. No.: 10/062,215

(22) Filed: Feb. 1, 2002

(65) Prior Publication Data

US 2002/0145173 A1 Oct. 10, 2002

Related U.S. Application Data

(62) Division of application No. 09/658,202, filed on Sep. 8, 2000, now Pat. No. 6,376,870.

(51) Int. Cl.[7] .................................. H01L 29/00

(52) U.S. Cl. ................... 257/500; 257/517; 257/288; 257/369

(58) Field of Search ................... 257/500, 517, 257/519, 288, 369, 371, 391

(56) References Cited

U.S. PATENT DOCUMENTS 4,819,049 A * 4/1989 Johnston et al. ............ 257/500

* cited by examiner

Primary Examiner—Carl Whitehead, Jr.
Assistant Examiner—Yennhu B. Huynh

(57) ABSTRACT

A high-breakdown voltage transistor (30; 30') is disclosed. The transistor (30; 30') is formed into a well arrangement in which a shallow, heavily doped, well (44) is disposed at least partially within a deeper, more lightly-doped well (50), both formed into an epitaxial layer (43) of the substrate (42). The deep well (50) is also used, by itself, for the formation of high-voltage transistors, while the shallower well (44) is used by itself in low-voltage, high-performance transistors. This construction permits the use of high-performance, and precisely matching, transistors in high bias voltage applications, without fear of body-to-substrate (or "back-gate-to-substrate") junction breakdown.

13 Claims, 4 Drawing Sheets

METHOD FOR MAKING LOW VOLTAGE TRANSISTORS WITH INCREASED BREAKDOWN VOLTAGE TO SUBSTRATE HAVING THREE DIFFERENT MOS TRANSISTORS

CROSS-REFERENCE TO RELATED APPLICATIONS

This is a divisional application of application Ser. No. 09/658,202 filed Sep. 8, 2000 now U.S. Pat. No. 6,376,870.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to the construction of field-effect transistors used in such circuits.

A continuing trend in the field of electronic integrated circuits is the reduction in transistor feature size. These smaller feature sizes enable a higher level of functionality for the integrated circuit, and also significantly reduce the manufacturing cost of the circuit. The manufacturing cost is reduced not only by increasing the number of integrated circuit dies that may be fabricated on a single wafer (and thus for substantially the same cost), but also by increasing the theoretical yield of the wafer for a given defect density by reducing the area affected by a single "killing" defect. Additionally, the performance of the integrated circuit generally improves along with the faster switching times provided by smaller transistors.

The reduction in transistor feature sizes has necessitated, in many instances, a reduction in the operating voltages applied to the integrated circuit, because many of the device breakdown voltages are lower for smaller devices. For example, a smaller channel length in a metal-oxide semiconductor (MOS) transistor generally translates into a lower source-to-drain breakdown voltage. Additionally, reduction in lateral transistor feature sizes, such as channel lengths and electrode widths, generally also necessitates reduced junction depths and other vertical features.

Some integrated circuit applications still require high voltage operation, however. For example, the use of integrated circuits in motor control and automotive applications may require high-voltage output signals, because of the load requirements of such devices. Additionally, some environments may also require integrated circuits to be able to withstand high bias voltages. Accordingly, modern integrated circuits utilizing extremely small active devices and transistors are not directly suitable for these applications.

In the past, separate "power" integrated circuits were used in combination with low-voltage high-performance integrated circuits in high-voltage applications. In this way, the high-performance integrated circuits could control the power ICs, which in turn would sink and source the high voltage or high current signals required by the application. Of course, for purposes of cost reduction, reduced form factor, and performance, it is desirable to integrate as much functionality as possible into the same integrated circuit. As a result, many modem integrated circuits include both high-performance (or "low-voltage") and high-voltage transistors.

However, the manufacturing processes required for integrating both high-performance and high-voltage transistors into the same integrated circuit can become quite complicated. It has been observed, in connection with the present invention, that the differences in construction between conventional low-voltage and high-voltage transistors do not permit optimization of both transistors in the same process. These differences are particularly dramatic in the formation of the wells into which the transistors are formed. As a result, conventional manufacturing flows utilize separate processes for the fabrication of low-voltage and high-voltage transistors.

Figure 1A:
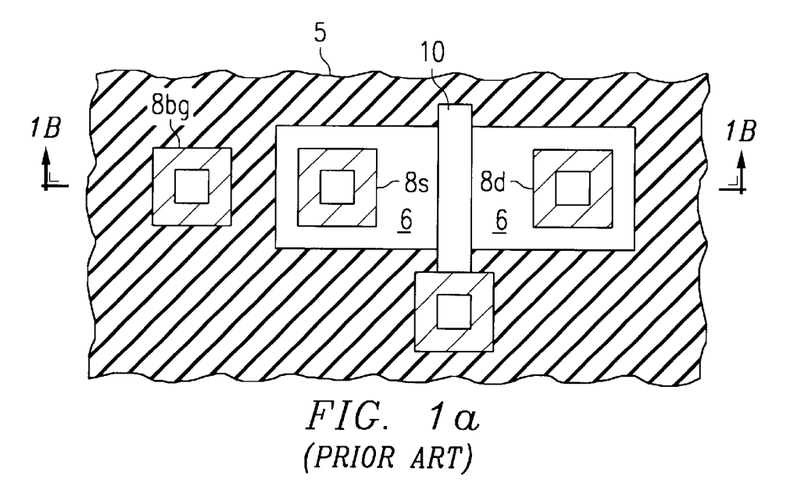
FIGS. 1a and 1b are a plan view and cross-sectional view, respectively, of a conventional low-voltage MOS transistor.
Figure 1B:
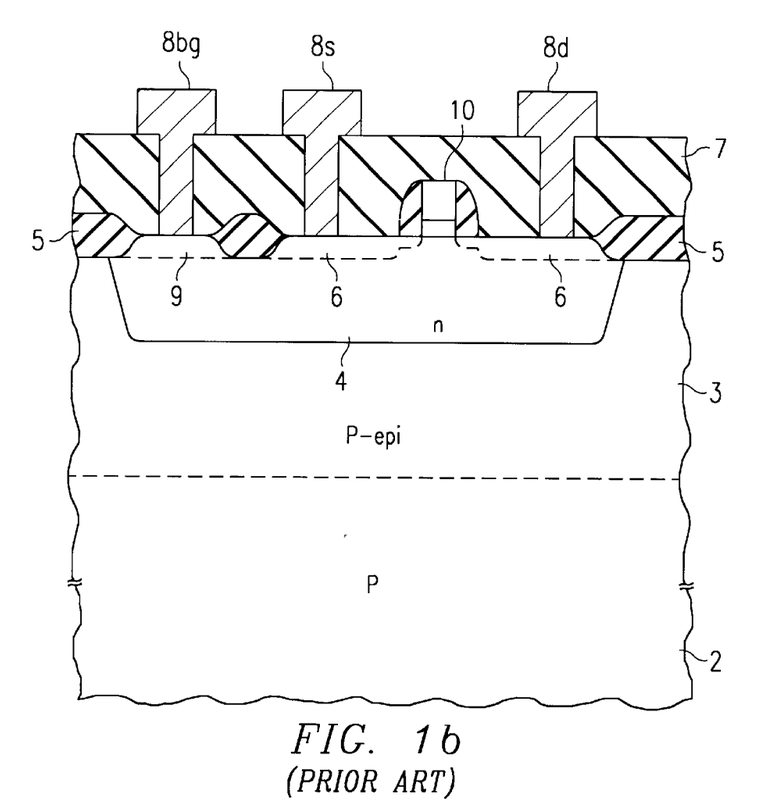

Referring now to FIGS. 1a and 1b, the construction of a conventional high-performance, or "low-voltage", p-channel MOS transistor is illustrated in plan and cross-sectional views, respectively. In this example, the transistor is formed at a surface of p-type substrate 2, on which p-type epitaxial layer 3 is formed in the conventional manner. The transistor is formed into n-well 4, which serves as the body region of the MOS transistor. Field oxide structures 5, which may be either conventional LOCOS thermal silicon oxide or silicon oxide deposited into recesses etched into the surface, define the active regions of the device. Polysilicon gate electrode 10 is disposed over a selected location of this active region, and p+ diffused regions 6 are formed into n-well 4 at locations not covered by field oxide structure 5 and gate electrode 10; as a result, p-type source and drain regions of the transistor are formed in a self-aligned manner relative to gate electrode 10. Sidewall filaments may be provided on the sides of gate electrode, if desired, to facilitate later silicidation of the structure and to permit the formation of graded source-drain junctions (typically more appropriate for n-channel devices). Following the deposition of multilevel insulator 7 (which is not shown in FIG. 1a to permit viewing of the structure) and the etching of contact openings through this film, metal conductors 8 may be formed in the conventional manner to make contact to the desired elements of the transistor. In this example, metal electrodes 8s and 8d make contact to the source and drain of the transistor, respectively, while metal electrode 8bg makes a "back-gate" contact (also referred to as a "body" contact) to well 4 via n+ diffused region 9, so that the body region of the device may be biased to a desired voltage.

Several features of the transistor of FIGS. 1a and 1b are specific to low-voltage, high-performance, devices. Generally, n-well 4 will be relatively shallow, and relatively heavily doped (although not as heavily doped as source-drain regions 6). For example, in a conventional sub-micron process, n-well 4 may be on the order of two microns deep into epitaxial layer 3, and may have a doping concentration of on the order of $3 \times 10^{16}$ cm$^{-3}$ resulting in a sheet resistance of on the order of 850 Ω/square. By making n-well 4 to be relatively shallow and heavily-doped, short-channel-length transistors formed in well 4 can have relatively high gain values of $g_m$ (or k'), and this will have quite high performance. In addition, this construction permits excellent transistor matching behavior, as is necessary for precise applications such as current mirror circuits.

However, the heavy doping of n-well 4 necessary for high transistor gain results in relatively low breakdown voltages. For example, the transistor of FIGS. 1a and 1b can have a source-drain breakdown voltage of on the order of five volts or lower. Additionally, the heavy doping of n-well 4 can limit the junction breakdown voltage at its interface with epitaxial layer 3 to as low as 25 volts or lower. While these breakdown voltages are well-suited for many high-speed circuit applications, some motor control and automotive applications cannot be implemented using such devices.

Figure 2A:
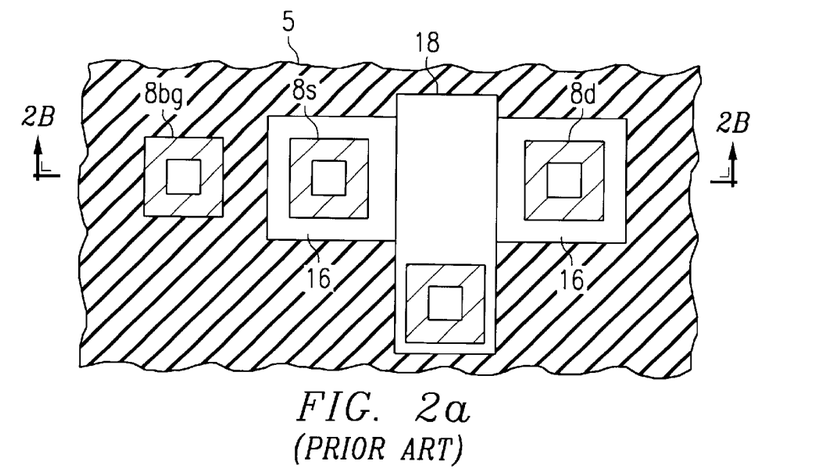
FIGS. 2a and 2b are a plan view and cross-sectional view, respectively, of a conventional high-voltage MOS transistor.
Figure 2B:
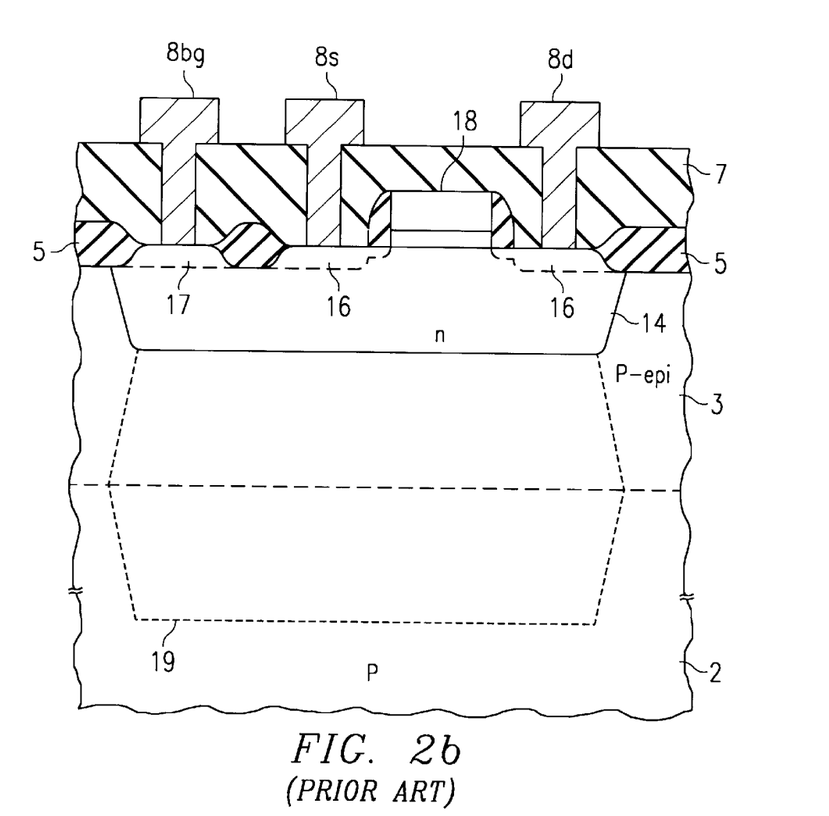

FIGS. 2a and 2b illustrate the construction of a high-voltage transistor, for which the breakdown voltages are significantly higher than in the case of the low-voltage transistor described above. This high-voltage transistor has many common features with the transistor of FIGS. 1a and 1b, including p+ diffused regions 16 and n+ diffused region 17, the locations of which are defined by field oxide structures 5 and gate electrode 18. Gate electrode 18 is significantly wider (from source-to-drain) than gate electrode 10 in the low-voltage transistor, providing a longer channel length and thus a higher source-drain breakdown voltage (e.g., on the order of ten to fifteen volts). This longer channel length is acceptable for this device, considering that transistor gain is not a major concern for high-voltage transistors. Metal electrodes 8bg, 8s, 8d are provided to make contact to the body node, source, and drain respectively.

The high-voltage transistor is also similarly formed into substrate 2 and epitaxial layer 3. However, n-well 14 is significantly more lightly doped, and also deeper, than the corresponding n-well 4 in the low-voltage device. For example, n-well 14 may have a doping concentration of on the order of $4 \times 10^{15}$ cm$^{-3}$, resulting in a sheet resistance of on the order of 2150 $\Omega$/square; the depth of n-well 14 may be on the order of 4 to 5 microns, which is approximately twice as deep as in the low-voltage device. In some applications, n-type buried layer 19 may also be provided beneath the high-voltage transistor; this region is not necessary to the operation of the high-voltage transistor, but if such a buried layer is otherwise available (e.g., as a buried collector for bipolar transistors implemented in the same integrated circuit), layer 18 may be incorporated into the high-voltage transistors as shown in FIG. 2b.

The deeper and more lightly-doped n-well 14 results in a significantly higher body-to-substrate breakdown voltage than in the case of the low-voltage devices. For example, a high-voltage transistor constructed as described above may have a substrate breakdown voltage of on the order of 60 volts. However, this deep lightly-doped well significantly affects the performance of the device, greatly reducing the gain characteristics. As a result, these high-voltage devices are not suitable for use in performance-critical circuit locations. Additionally, the light doping of the well inserts a significant amount of variability into the construction of the high-voltage device, such that high-voltage devices fabricated in the same die do not match one another as well as low-voltage transistors.

Because of the dichotomy between the performance and breakdown characteristics presented by conventional low-voltage and high-voltage transistors, the circuit design must be careful to not require high-performance or closely-matched transistors in locations that may receive high bias voltages (either across source-drain or between the body region and substrate). These constraints may, in some cases, only be met by sacrificing circuit performance. However, the particular circuit may not be sufficiently robust to tolerate such optimization.

BRIEF SUMMARY OF THE INVENTION

It is therefore an object of the present invention to provide a high-voltage transistor having an increased body-to-substrate breakdown voltage.

It is a further object of the present invention to provide such a transistor that can be constructed using existing process operations.

It is a further object of the present invention to provide such a transistor that is suitable for use in a circuit utilizing precise matched devices in a high voltage environment.

Other objects and advantages of the present invention will be apparent to those of ordinary skill in the art having reference to the following specification together with its drawings.

The present invention may be implemented into an integrated circuit that includes both high-voltage devices and at least one low-voltage, high-performance device. The low-voltage device is formed into a well that includes a shallow, heavily doped well formed into the deep, lightly-doped n-well. Other low-voltage devices not subject to high bias voltages, and other high-voltage devices, are formed into their own wells, namely the conventional shallow, heavily doped well for low-voltage transistors, and the deeper, more lightly-doped well for high-voltage devices.

DETAILED DESCRIPTION OF THE INVENTION

The present invention may be realized within many types of integrated circuit, as well as various classes of transistors. As such, those skilled in the art will recognize from this specification that the present invention may be utilized in connection with a wide range of applications, and that therefore the following description is presented by way of example only.

Figure 3:
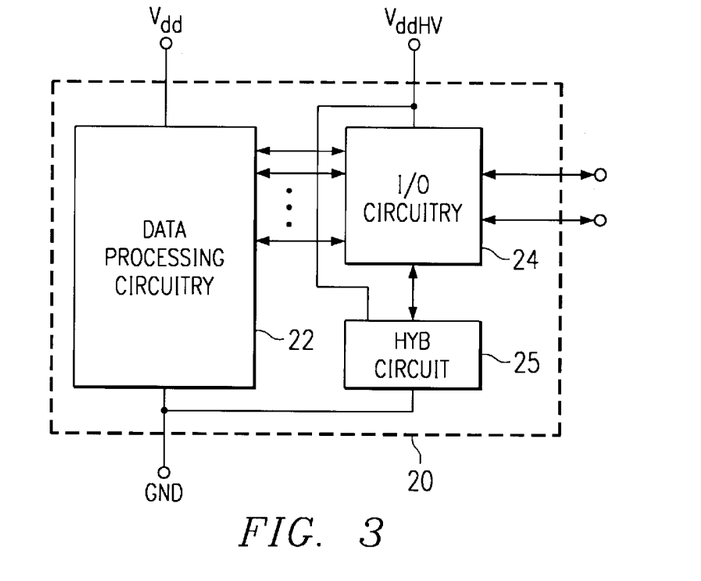
FIG. 3 is an electrical diagram, in block form, of an integrated circuit incorporating the preferred embodiment of the invention.

Referring now to FIG. 3, integrated circuit 20, into which the preferred embodiments of the present invention may be implemented, is illustrated at a relatively high level. It is contemplated that integrated circuit 20, in this example, is intended for use in connection with a high voltage application, such as a motor control or automotive system. Integrated circuit 20 includes data processing circuitry 22, which in this example is relatively complex high performance digital circuitry, and as such is realized by conventional low-voltage, high-performance transistors such as those described above relative to FIGS. 1a and 1b. Data processing circuitry 22 is biased by power supply voltage $V_{dd}$, which is a relatively low voltage such as on the order of 3.3 volts. Input/output circuitry 24, on the other hand, is a block of high voltage circuitry such as may be used to communicate with high voltage load circuitry external to integrated circuitry 20, and as such may therefore involve high voltage swings at its terminals. In this regard, input/output circuitry 24 is biased by power supply voltage $V_{ddHV}$, which is a high voltage such as on the order of sixty volts. As such, input/output circuitry 24 is realized by way of conventional high-voltage transistors such as those described above relative to FIGS. 2a and 2b.

According to this preferred embodiment of the invention, integrated circuit 20 also includes high voltage analog circuit 25. High voltage analog circuit 25 performs a specific function useful by either or both of data processing circuitry 22 and input/output circuitry 24, but is biased by high power supply voltage $V_{ddHV}$ and ground, as shown in FIG. 3. As such, high voltage analog circuit 25 includes high-voltage transistors such as those described above relative to FIGS. 2a and 2b. However, according to this preferred embodiment of the invention, certain devices within high voltage analog circuit 25 must have the properties of low-voltage transistors. For example, these certain devices may need to have high gain or rapid switching characteristics, or a pair of devices may need to be extremely closely matched relative to one another. These attributes necessitate the use of a relatively heavily doped and shallow n-well, for the case of a p-channel MOS device. However, given the high bias voltage applied by power supply $V_{ddHV}$, the conventional low-voltage transistor construction in FIGS. 1a and 1b would break down at such voltages.

Figure 4:
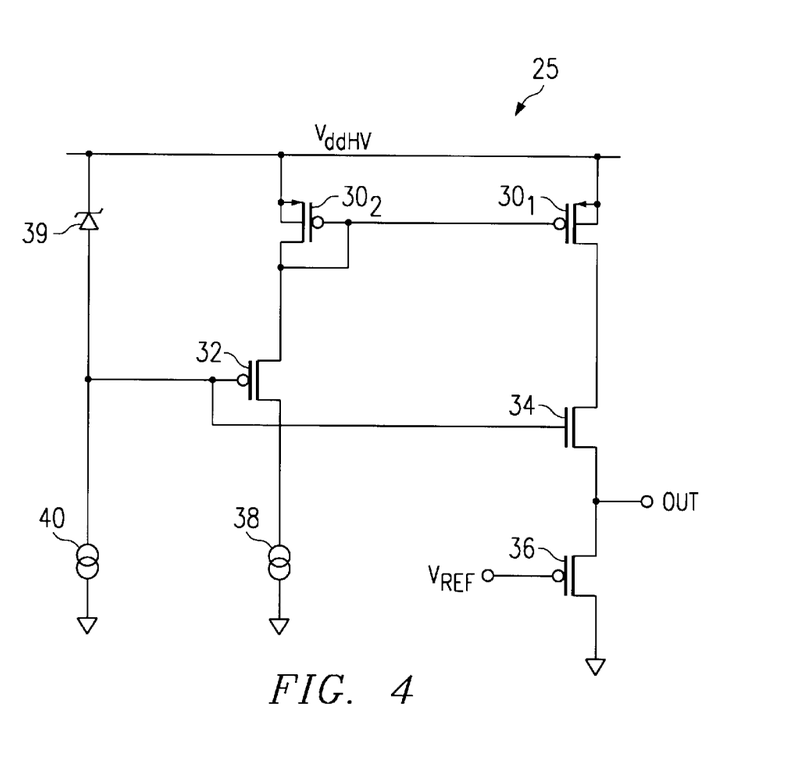
FIG. 4 is an electrical diagram, in schematic form, of a circuit within the integrated circuit of FIG. 3, incorporating transistors constructed according to the preferred embodiment of the invention.

FIG. 4 illustrates an example of high voltage analog circuit 25 which is biased by high voltage power supply $V_{ddHV}$ but yet requires close matching between transistors. In the example of FIG. 4, high voltage analog circuit 25 is controlled by a reference voltage $V_{REF}$, and has two legs between high voltage power supply $V_{ddHV}$ and ground. A reference leg includes n-channel transistor 36 having its source at ground and its gate receiving reference voltage $V_{REF}$. The drain of transistor 36 is connected to the drain of p-channel transistor 34, which has its source connected to the drain of p-channel mirror transistor $30_1$. Mirror transistor $30_1$ has its source biased to high voltage power supply $V_{ddHV}$; the body node, or back gate, of mirror transistor $30_1$ is also biased to high voltage power supply $V_{ddHV}$. In the mirror leg, p-channel mirror transistor $30_2$ also has its source and body node biased to high voltage power supply $V_{ddHV}$. The gate of p-channel mirror transistor $30_2$ is connected to its drain, and also to the gate of mirror transistor $30_1$. The drain and gate of mirror transistor $30_2$ is connected to the source of p-channel transistor 32, which in turn has its drain coupled to ground via current source 38. The gates of transistors 32, 34 are connected in common to a node between pull-down current source 40 and the anode of Zener diode 39; the cathode of Zener diode 39 is also biased to high voltage power supply $V_{ddHV}$.

In operation, high voltage analog circuit 25 operates substantially as a current mirror, in that the current drawn through mirror transistor $30_1$, under the control of reference transistor 36, is mirrored (either one-to-one, or by a selected multiple) through mirror transistor $30_2$ and thus through the mirror leg of the circuit. For proper operation, it is important that mirror transistors $30_1$, $30_2$ match one another, in performance characteristics, as closely as possible. If the mirrored current is to be a multiple of that drawn through the reference leg, mirror transistors $30_1$, $30_2$ will not identically match one another, but instead must be at a very precise gain relationship relative to one another. This precision in the current relationships of mirror transistors $30_1$, $30_2$ necessitates that these devices be fabricated as low-voltage transistors, with relatively shallow, heavily-doped, wells, as noted above. On the other hand, because the other transistors 32, 34, 36 need not be so precisely matched and because their switching speed is not a critical factor, these transistors 32, 34, 36 may be fabricated as conventional high-voltage transistors, such as described above relative to FIGS. 2a and 2b.

However, as shown in FIG. 4, the back gates, or body nodes, of mirror transistors $30_1$, $30_2$ are biased to high voltage power supply $V_{ddHV}$. Considering that the substrate of the integrated circuit containing mirror transistors $30_1$, $30_2$ will be biased to ground or at most to a relatively low voltage, and considering that high voltage power supply $V_{ddHV}$ may be as high as sixty volts, mirror transistors $30_1$, $30_2$ must have a high substrate breakdown voltage. The source/drain breakdown voltage of mirror transistors $30_1$, $30_2$ is not so very high, however, as the voltage drop across these transistors in high voltage analog circuit 25 of FIG. 4 is quite low, limited by the Zener diode breakdown. According to the present invention, mirror transistors $30_1$, $30_2$ are constructed in such a manner as to provide excellent matching (and also high performance switching speeds) and also a high breakdown voltage to substrate, without adding to the complexity of the manufacturing process.

Figure 5:
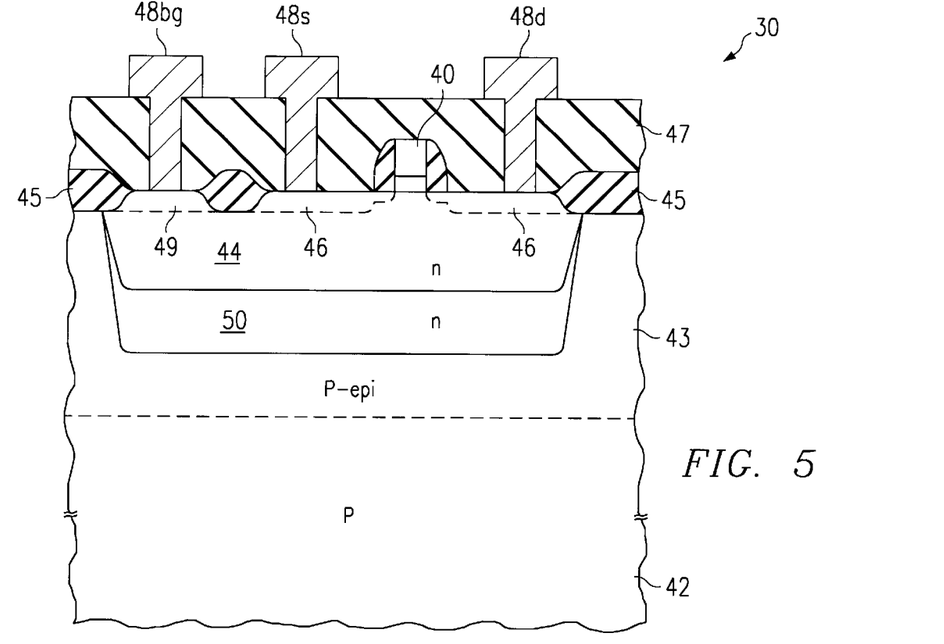
FIG. 5 is a cross-sectional view of a low-voltage MOS transistor constructed according to a first preferred embodiment of the invention.

Referring now to FIG. 5, the construction of transistors $30_1$, $30_2$ according to a first preferred embodiment of the present invention will now be described relative to an exemplary transistor 30. Transistor 30 is formed at a surface of p-type substrate 42, on which p-type epitaxial layer 43 is formed in the conventional manner. At the surface of the device, transistor 30 is substantially identical to the conventional low voltage transistor such as described above relative to FIGS. 1a and 1b, and as used elsewhere in integrated circuit 20 (e.g., in data processing circuitry 22). P+ diffused regions 46 form source and drain regions, and n+ diffused region 49 forms a body contact region, at surface locations defined by field oxide structures 45 and, in the case of the source and drain regions, by gate electrode 40. Multilevel dielectric 47 provides insulation between these diffused regions and the overlying metal electrodes 48. Electrodes 48bg, 48s, 48d make contact to the body contact, source, and drain of transistor 30, respectively.

According to this preferred embodiment of the invention, transistor 30 is formed into two n-type wells 44, 50 in epitaxial layer 43. N-type well 44 is a relatively shallow heavily-doped well, as is used elsewhere in integrated circuit 20 for the formation of low-voltage high performance transistors, such as in data processing circuitry 22. For example, n-well 44 may be on the order of two microns deep. According to this first embodiment of the invention, n-well 44 is formed within deep n-well 50, which is a deeper, more lightly-doped n-well, as used elsewhere in integrated circuit 20 for the formation of high voltage transistors, such as transistors 32, 34 of high voltage analog circuit 25. For example, n-well 50 may extend to a depth of four to five microns, and in its portion beyond well 44, may have a doping concentration of on the order of $4 \times 10^{15}$ cm$^{-3}$, with a sheet resistance of on the order of 2150 Ω/square. At locations in integrated circuit 20 away from transistors 30, n-well 44 is formed to have a doping concentration of on the order of $3 \times 10^{16}$ cm$^{-3}$, and thus a sheet resistance of on the order of 850 Ω/square. At the locations of transistor 30 within deep n-well 50, however, the doping concentration of n-well 44 will be slightly higher, as dopant from both wells 44, 50 will be present; it is contemplated, however, that transistor body regions will be only slightly affected by the double-well doping, effectively providing the same transistor operation as if n-well 50 were not present.

These wells 44, 50 into which transistor 30 is formed are formed in the same process steps as the formation of the corresponding wells used in low-voltage and high-voltage transistors elsewhere in integrated circuit 20. As shown in FIG. 5 and described above, however, transistor 30 is formed in the combination of these wells. On the other hand, the low-voltage and high-voltage transistors elsewhere in integrated circuit 20 are formed into only one or the other of wells 44, 50, respectively.

While not shown in the example of FIG. 5, a buried n+ layer may be provided underlying deep n-well 50 for transistor 30. This buried layer would be similar to layer 18 shown above in FIG. 2b, and would serve to even out the local potentials within well 50; such buried layers are typically used as buried collectors for bipolar transistors, and as such would typically be used in connection with transistor 30 only if otherwise available. It is contemplated that the benefits of the present invention would be attained either with or without such a buried layer.

Referring back to FIG. 5, because n-well 44 is relatively shallow and heavily-doped, short-channel-length transistors 30 according to this preferred embodiment of the invention have relatively high gain values of $g_m$ (or k'), and thus rapid switching times. More importantly, for applications such as that of high voltage analog circuit 25 shown in FIG. 4, these attributes of well 44 permit excellent transistor matching behavior, as is necessary for precise applications such as that described above for high voltage analog circuit 25.

The addition of deep n-well 50 into transistor 30 provides excellent improvement to the breakdown voltage from the body region of transistor 30 to substrate 2. This improvement is due not only to the depth of n-well 50, but is also due to the significantly lighter doping concentration of n-well 50.

Therefore, transistor 30 according to this preferred embodiment of the invention provides the benefits of excellent device characteristic matching, and high performance, but with greatly improved substrate breakdown voltages. The combination of these factors is obtained, according to the preferred embodiments of the invention, at no added manufacturing cost, considering that both wells 44, 50 are otherwise present in the device. As a result, the circuit designer is able to rely on low-voltage transistors even in a high bias environment, such as transistors $30_1$, $30_2$ in high voltage analog circuit 25, as long as drain-to-source voltage limits are not exceeded.

For most purposes, the construction of transistor 30 according to this first preferred embodiment of the invention is adequate. However, considering that the ion implant doses for forming regions 46 in transistor 30 will be identical to that used for low-voltage transistors elsewhere in integrated circuit 20, the actual net doping concentration of regions 46 in transistor 30 will slightly differ from that in the other low-voltage transistors, considering that the actual well doping of transistor 30 will include both the dopant of well 44 and also the dopant for deep n-well 50. This could cause a drop in performance of these transistors 30, depending upon the process and the specific well concentrations.

Figure 6:
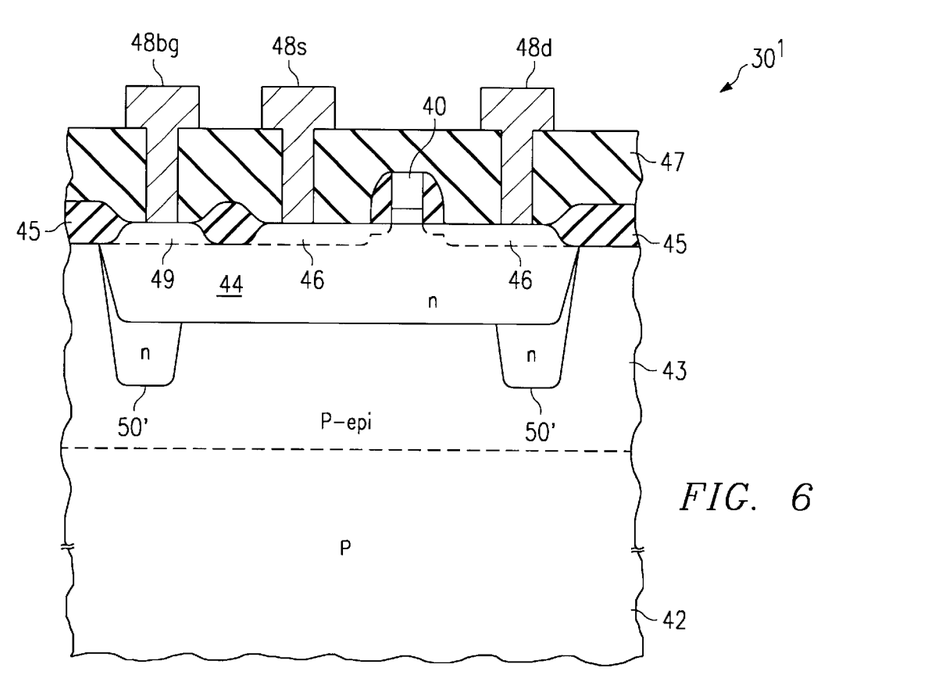
FIG. 6 is a cross-sectional view of a low-voltage MOS transistor constructed according to a second preferred embodiment of the invention.

According to a second preferred embodiment of the invention, the deleterious effects of such additional doping in the source-drain regions are avoided. FIG. 6 illustrates transistor 30', formed according to this second preferred embodiment of the invention. Transistor 30' is similarly suitable for use as transistors $30_1$, $30_2$ in high voltage analog circuit 25, and in other similar applications for which either high performance or precise matching is required, but where high bias voltages are also necessary.

As shown in FIG. 6, transistor 30' is similarly constructed as transistor 30 in FIG. 5, except that deep n-well 50' is limited to the edges of n-well 44. As is known in the art, junction breakdown tends to occur at sharp corners, as the electric fields are maximized at these locations. Accordingly, n-well 50' in this embodiment of the invention is formed to cover the corners of n-well 44, and is pulled away from the flat portion under the active source/drain regions of p+ diffusions 46 near gate electrode 40. As a result, the portions of n-well 44 near the source/drain regions have not received the additional n-type doping for forming deep n-well 50', and will thus have exactly the same net doping concentration as the other low-voltage transistors in integrated circuit 20, and thus the same performance.

The use of n-well portions 50' according to this second preferred embodiment of the invention will generally require an increase in the size of the active region, to ensure that lateral diffusion of the well portions 50' does not encroach into the active transistor region. This increased size is evident from a comparison of FIGS. 5 and 6, particularly along the drain side of transistor 30'.

In either case, the present invention provides high-performance transistors that have increased substrate junction breakdown voltage. This permits the use of low-voltage transistors in high voltage applications, thus taking advantage of the high gain and precise matching provided by those transistors. In addition, this ability is provided without adding to the manufacturing cost of the integrated circuit, as only existing well diffusions are necessary.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A process for making a first, second, and third different types of MOS transistors in respective first, second and third regions of a semiconductor substrate comprising:

a. forming a first well in the first region by implanting ions of a first certain species, energy and dosage in the first regions, the first well having a first certain depth and sheet resistance;

b. forming a second well in the second region by implanting ions of a second certain species, energy, and dosage in the second region that is different from the first certain energy and dosage, the second well having a second certain depth and sheet resistance that is different from the first certain depth and sheet resistance;

c. forming a third well in the third region by implanting ions in the third region of the first certain species, energy, and dosage at the time of the forming of the first well and by implanting ions in the third region of the second certain species, energy, and dosage at the time of the forming of the second well, the implanted ions in the third well including the sum of the implanted ions in the first and the second wells, the third well having a third certain depth and sheet resistance that is different from the first and the second certain depths and sheet resistances;

d. forming a first type of an MOS transistor in the first well, the first well being the body and the channel region of the first type of MOS transistor;

e. forming a second type of an MOS transistor in the second well, the second well being the body and the channel region of the second type of MOS transistor; and f. forming a third type of an MOS transistor in the third well, the third well being the body and the channel region of the third type of MOS transistor.

2. The process of claim 1, in which the semiconductor substrate includes silicon.

3. The process of claim 1, in which the MOS transistors are formed in a first epitaxial layer.

4. The process of claim 3, in which the first epitaxial layer includes silicon.

5. The process of claim 3, in which a buried layer of a certain thickness and sheet resistance is formed beneath the first epitaxial layer.

6. The process of claim 5, in which the buried layer is formed in a second epitaxial layer.

7. The process of claim 6, in which the second epitaxial layer includes silicon.

8. The process of 7, in which the substrate is p-type, the first and the second epitaxial layers are p-type, and the buried layer is n-type, and the first, second, and third types of MOS transistors are PMOS transistors.

9. The process of claim 8 in which the body to substrate breakdown voltage of the first type and the third type of PMOS transistors is above 60 volts.

10. The process of process 1 in which the first well is formed by phosphorous ion implantation, having a depth range of 4 to 5 micrometers and a sheet resistance of about 2150 ohms per square.

11. The process of claim 1 in which the second well is formed by phosphorous ion implantation, having a depth of about 2 micrometers and a sheet resistance of about 850 ohms pre square.

12. The process of process 1 in which the first well is deeper and less heavily doped than the second well.

13. A process for making a first, second, and third different types of PMOS transistor in respective first, second and third regions of a p-type silicon substrate comprising:

a. forming a first p-type epitaxial silicon layer having a certain thickness and resistivity on the surface of the substrate;

b. forming an n-type buried layer having certain thickness and sheet resistance in the first and the third regions on the surface of the first epitaxial layer;

c. forming a second p-type epitaxial silicon layer having a certain thickness and sheet resistance over the first epitaxial layer and the buried layer;

d. forming a first n-well in the first region by implanting phosphorous ions of a first certain species, energy and dosage in the first regions, the first n-well having a depth of 4 to 6 micrometers and a sheet resistance of about 2150 ohms per square;

e. forming a second n-well in the second region by implanting phosphorous ions of a second certain energy and dosage in the second region, the second n-well having a depth of about 2 micrometers and a sheet resistance of about 850 ohms per square;

f. forming a third n-well in the third region by implanting phosphorous ions in the third region of the first certain energy and dosage at the time of the forming of the first n-well, and by implanting phosphorous ions in the third region of the second certain energy and dosage at the time of the forming of the second n-well, the implanted phosphorous ions in the third n-well including the sum of the implanted phosphorous ions in the first and the second n-wells, the third n-well having a third certain depth and sheet resistance that is different from the first and the second certain depths and sheet resistances;

g. forming in the first well a first type of PMOS transistor, the first well forming the body and the channel region of the transistor of which the body to substrate breakdown voltage is above 60 volts;

h. forming in the second well a second type of PMOS transistor, the second well forming the body and the channel region of the transistor of which the gain is high and matching capability is good; and i. forming in the third well a third type of PMOS transistor, the third well forming the body and the channel region of the transistor of which the gain is high and matching capability is good, and the body to substrate breakdown voltage is above 60 volts.

* * * * *

UNITED STATES PATENT AND TRADEMARK OFFICE
CERTIFICATE OF CORRECTION

PATENT NO. : 6,600,205 B2  
APPLICATION NO. : 10/062215  
DATED : July 29, 2003  
INVENTOR(S) : John H. Carpenter, Jr. et al.

It is certified that error appears in the above-identified patent and that said Letters Patent is hereby corrected as shown below:

Title Page, Item (76) Inventors:

Correct the inventorship to add as the fourth inventor the following: Ross E. Teggatz 2908 Stonepointe, McKinney, TX 75070

Signed and Sealed this

Twenty-seventh Day of May, 2008

JON W. DUDAS  
*Director of the United States Patent and Trademark Office*